United States Patent [19]

Miyashita et al.

[11] Patent Number: 4,980,300

[45] Date of Patent: Dec. 25, 1990

[54] GETTERING METHOD FOR A SEMICONDUCTOR WAFER

[75] Inventors: Moriya Miyashita, Kitakami; Shintaro Yoshii; Keiko Sakuma, both of Tokyo, all of Japan

[73] Assignee: Kabushiki Kaisha Toshiba, Kawasaki, Japan

[21] Appl. No.: 275,864

[22] Filed: Nov. 25, 1988

[30] Foreign Application Priority Data

Nov. 28, 1987 [JP] Japan .................. 62-300356

[51] Int. Cl.⁵ ................ H01L 21/463; H01L 21/304; B08B 3/12
[52] U.S. Cl. ........................ 437/10; 437/9; 437/946; 134/1
[58] Field of Search .............. 134/1, 2, 3, 184; 437/9, 10, 946

[56] References Cited

U.S. PATENT DOCUMENTS

| 4,092,176 | 5/1978 | Kozai et al. | 134/186 |
| 4,854,337 | 8/1989 | Bunkenburg | 134/1 |
| 4,902,350 | 2/1990 | Steele | 134/1 |

FOREIGN PATENT DOCUMENTS

| 55-1114 | 1/1980 | Japan | 437/9 |
| 60-72233 | 4/1985 | Japan | 437/946 |
| 61-207022 | 9/1986 | Japan | 437/9 |
| 56-60022 | 5/1981 | Japan | 437/9 |

OTHER PUBLICATIONS

International Electronics, vol. 1, No. 2, Feb. 1961, pp. 27–28: "Ultrasonics Cleans Delicate Parts Really Clean".
JP-A-61 15 334 (Tasu Gijutsu Kenkyusho K.K.) 23-01-1986.
JP-A-61 79 234 (Matsushita Electronics Corp.) 4/1986.
VLSI Process Data Handbook; Toru Hara et al.; 1982, (pp. 271–274).

Primary Examiner—Olik Chaudhuri
Assistant Examiner—Ourmazd S. Ojan
Attorney, Agent, or Firm—Finnegan, Henderson, Farabow, Garrett and Dunner

[57] ABSTRACT

When a surface of semiconductor wafer is treated for gettering, ultrasonic waves are caused to propagate along the surface of the semiconductor wafer, through pure water. Mechanical damages are formed on the surface of the semiconductor wafer along which the ultrasonic waves propagated, the damages serving as a back side damage.

22 Claims, 2 Drawing Sheets

GETTERING METHOD FOR A SEMICONDUCTOR WAFER

BACKGROUND OF THE INVENTION

1. Field of the Invention

The present invention relates to a semiconductor wafer surface treatment method and, more particularly, to a method of treating a surface of a semiconductor wafer so that one surface of the wafer may be mechanically damaged for gettering of contaminants.

2. Description of the Related Art

Along the development of micropatterning of semiconductor elements, it becomes important that influence due to various types of contamination in element manufacturing processes is decreased. For example, contamination with heavy metals such as Cu or Fe reduces life time of minority carriers, thus changing characteristics of a transistor, or increasing a leakage current. In addition, by contamination with sodium (Na), mobile ions are generated in an oxide film, thereby degrading stability of an operation of the elements.

So-called gettering is well-known as such a method of cleaning contamination of a semiconductor substrate generated in a manufacturing process. This gettering includes hydrochloric acid oxidation, phosphorus gettering, and the like which are performed during manufacturing processes. In another technique, a silicon wafer serving as a starting material has a gettering ability. In addition, gettering of a substrate includes intrinsic gettering which utilizes oxygen precipitate in the substrate, back side damage (to be referred to as a BSD hereinafter) which causes the back-side surface of the wafer (an opposite side surface to a major surface on which semiconductor elements are formed in the later steps) to be mechanically damaged or distorted, and the like.

Sandblasting is known as a conventional method of forming the above BSD. In this method, a solution obtained by dispersing fine particles of alumina is sprayed to a back-side surface of the silicon wafer to form a mechanical damage. Although this method is effective to form a mechanical damage, the method cannot provide high purity of the silicon wafer required in the manufacture of the semiconductor element. More specifically, the solution obtained by dispersing fine particles of alumina contains very small amounts of metal impurities such as Fe, Cr, Ni, and Cu. Surface analysis using an ion microanalyzer frequently demonstrated that these impurities are strongly attached to and remain on a wafer material as a surface contamination after the treatment. In addition, the back-side surface of the wafer is a roughened surface, and three-dimensional micropatterns are present therein. However, since a solution containing an alumina is sprayed to this uneven surface, the fine particles of alumina fill the recessed patterns in the back-side surface of the wafer. For these reasons, process defects are undesirably caused in manufacturing processes of the semiconductor element, as in the case of surface contamination due to metal impurities.

In a conventional case, treatment processes of the semiconductor wafer are performed in a clean room to manage cleanliness. However, in the sandblasting treatment process, fine particle of alumina solution is sprayed with high pressure. Therefore, the cleanliness in operation environment can be hardly maintained.

As described above, formation of BSD using the conventional sandblasting undesirably has low cleanliness.

SUMMARY OF THE INVENTION

It is, therefore, an object of the present invention to provide a method of treating a surface of a semiconductor substrate which can form a clean mechanical damage on a back-side surface of the substrate.

According to an embodiment of the present invention, there is provided a method of treating a surface of a semiconductor substrate comprising the steps of generating ultrasonic waves, and causing the ultrasonic waves to propagate along the surface of the semiconductor wafer through a treatment solution to form mechanical damages on one surface of the semiconductor wafer.

In such a method, the surface (back-side surface) of the semiconductor wafer is irradiated with ultrasonic waves propagating in pure water, so that mechanical damages may be formed on the surface. This damage serves as a back side damage. In addition, only pure water is brought into contact with the substrate, and impurities such as heavy metals or Na may not be attached to and remain on a wafer material as surface contamination after the treatment, as in the conventional case.

There is, therefore, provided a method of treating a surface of a semiconductor substrate which can form clean mechanical damage on the back-side surface of the wafer.

DETAILED DESCRIPTION OF THE PREFERRED EMBODIMENTS

Figure 1:
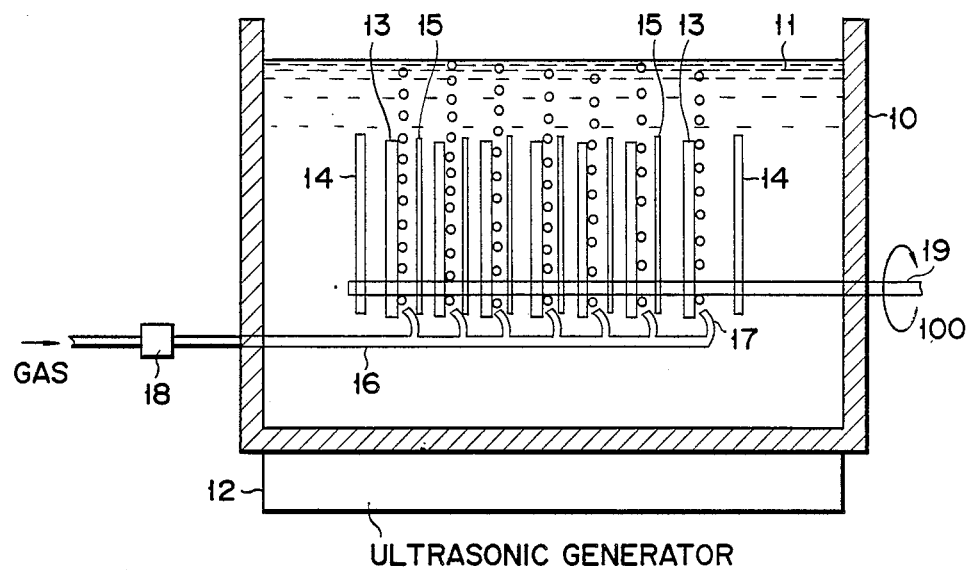
FIG. 1 is a front view for explaining an arrangement of a treatment device used when a treatment method of the present invention is performed.
Figure 2:
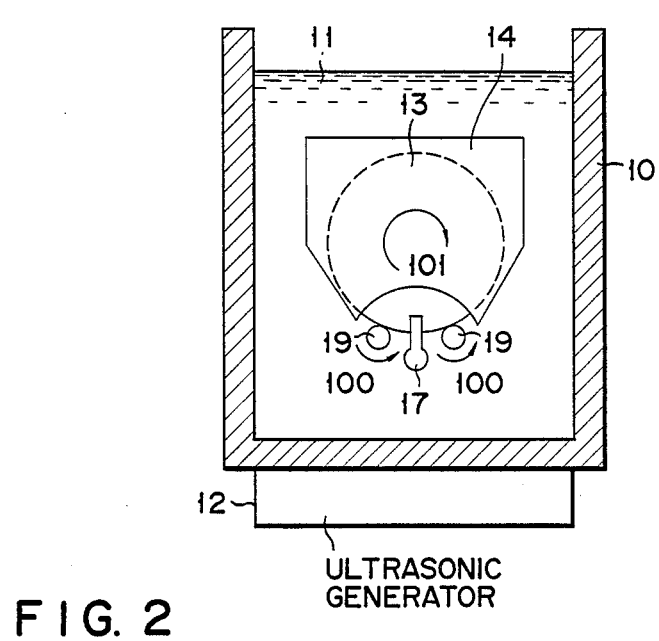
FIG. 2 is a side view of the treatment device shown in FIG. 1.

FIG. 1 is a front view showing an arrangement of a treatment device used when a method of the present invention is performed, and FIG. 2 is a side view thereof. However, in FIGS. 1 and 2, in order to explain a state in treatment bath 10, this treatment bath 10 is cut away to show its inner portion. Treatment bath 10 is filled with a treatment solution, e.g., ultra-pure water 11 or pure water. Ultrasonic generator 12 consisting of an ultrasonic wave oscillator and an ultrasonic wave diaphagm is arranged at a bottom portion of treatment bath 10. Ultrasonic waves generated by this ultrasonic generator 12 propagate in ultrapure water 11 in treatment bath 10. Wafer carrier 14 vertically containing a plurality of silicon wafers 13 each having mirror-finished surfaces is dipped in treatment bath 10. Partition plates 15 are disposed between adjoining wafers 13 in wafer carrier 14, respectively.

Gas supply tube 16 for supplying a gas such as air or nitrogen is disposed at a lower portion in treatment bath 10. Spray nozzle 17 is arranged midway along gas supply tube 16 so as to oppose a major surface side (a surface side on which semiconductor elements are formed in the following steps) of each silicon wafer 13 contained in wafer carrier 14, respectively. The gas is sprayed to the front surface of each substrate 13 from corresponding nozzle 17. Gas filter 18 is disposed midway along gas supply tube 16 outside treatment bath 10, thereby removing fine particles contained in the supplied gas.

As shown in FIG. 2, two rotating shafts 19 respectively rotated along the directions indicated by arrows 100 in FIG. 2 are arranged so as to be in contact with the outer surface of each silicon wafer 13 contained in wafer carrier 14. With rotations of rotating shafts 19, wafers 13 are rotated along the direction indicated by arrow 101 in FIG. 2.

In the treatment device having the above arrangement, treatment bath 10 is filled with ultra-pure water 11, and wafer carrier 14 containing a plurality of silicon wafers 13 is dipped therein. Ultrasonic generator 12 is operated to generate ultrasonic waves. In addition, the predetermined gas is supplied to gas supply tube 16 to perform a treatment. Therefore, by ultrasonic waves propagating in the ultra-pure water, three-dimensional mechanical damage or distortion is formed on the back-side surface of each silicon wafer 13 contained in wafer carrier 14. In this case, ultrasonic output is preferably selected within the range of 50 W to 500 W. Its frequency is preferably selected within the range of 10 kHz to 100 kHz. If the frequency is not selected within the above range, the wafers tend not to be damaged. In addition, if the output is 500 W or more, the damage is increased, thus leaving a large scratch on the surface of the wafer.

On the other hand, by spraying the gas from nozzles 17, bubbles are generated on the major surfaces of silicon wafers 13. These bubbles cause the ultrasonic waves on the wafer major surface sides to disappear. Partition plates 15 are arranged between adjoining wafers 13, respectively, so that ultrasonic waves do not propagate from an adjacent section. Therefore, mechanical damages are not formed on the major surface side of each wafer 13. Since wafers 13 are rotated by two rotating shafts 19, formation of mechanical damages on the back-side surface and step coverage of bubbles on the major surface of wafer 13 are uniformed.

The present inventors caused ultrasonic waves of 38 kHz to propagate in ultra-pure water using the above treatment device to perform a treatment for 15 minutes. As a result, it is confirmed that mechanical damages of about $1 \times 10^5$ (atoms/cm$^2$) are formed on the back-side surface of each silicon wafer 13. Since ultra-pure water is used, the number of impurity fine particles attached to the back-side surface is five pieces or less per wafer having a diameter of 5 inches. Metal contamination due to Cu, Fe, Ni, Al, and the like is $2 \times 10^{10}$ (atoms/cm$^2$) or less. A subsequent analysis revealed that wafers 13 are extremely clean.

Figure 3:
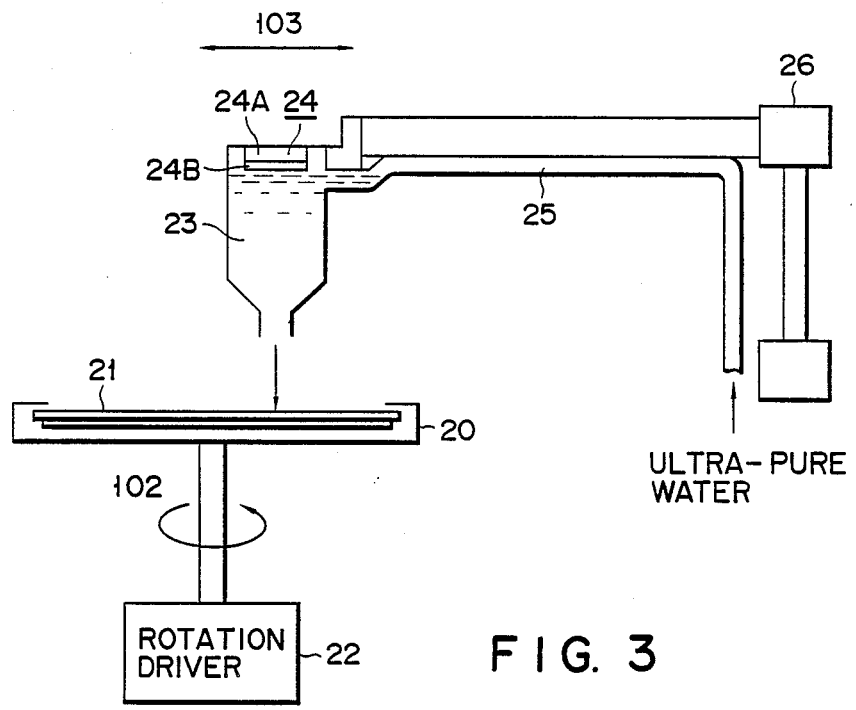
FIG. 3 is a front view showing another arrangement of the treatment device used when the treatment method of the present invention is performed.

FIG. 3 is a front view showing another arrangement of the treatment device used when a method of the present invention is performed. Wafer table 20 for horizontally holding silicon wafer 21 to be treated is rotated along the direction indicated by arrow 102 in FIG. 3 by rotation driver 22. This table 20 is rotated at, e.g., 100 rpm.

Nozzle 23 is disposed above wafer table 20. Ultrasonic generator 24 consisting of ultrasonic wave oscillator 24A and ultrasonic wave diaphagm 24B is arranged on the inner side of this nozzle 23. Ultra-sonic wave diaphagm 24B is disposed to oppose to wafer 21 so that wafer 21 can be easily irradiated with ultra-sonic waves through ultra-pure water. Supply tube 25 for supplying ultra-pure water is connected to a side wall of nozzle 23. Ultra-pure water is supplied to the inner space of nozzle 23 through this supply tube 25. Nozzle 23 is movable along the direction indicated by arrow 103 in FIG. 3 by nozzle scan driver 26.

In the treatment device having the above arrangement, silicon wafer 21 is horizontally held by wafer table 20 so that the major surface of the wafer faces down and the back-side surface thereof faces up. In addition, ultra-pure water is supplied to nozzle 23 from supply tube 25 and ultrasonic waves are generated by ultrasonic generator 24 to perform a treatment. In this case, as in the treatment device shown in FIGS. 1 and 2, an output of the ultrasonic waves is selected within the range of 50 W to 500 W, and its frequency is selected to be 38 kHz.

Figure 4:
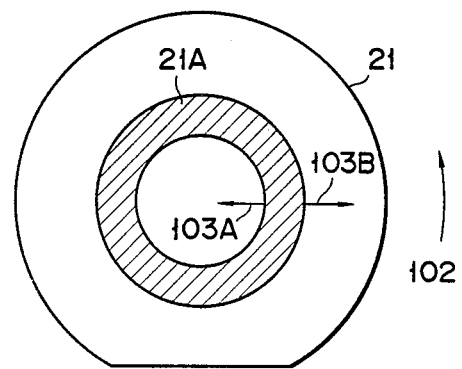
FIG. 4 is a view showing a semiconductor wafer during a treatment using the treatment device shown in FIG. 3.

When ultra-pure water is supplied to the inner space of nozzle 23, the ultra-pure water oscillated by ultrasonic waves is sprayed from the distal end of nozzle 23 onto the back-side surface of wafer 21 rotated on wafer table 20. Therefore, as shown in FIG. 4, region 21A of wafer 21 indicated by hatched lines in FIG. 4 is sprayed with the ultra-pure water, and mechanical damages are formed thereon. Thereafter, while wafer 21 is rotated in the direction indicated by arrow 102 in FIG. 4, nozzle 23 is moved by nozzle scan driver 26 in the direction indicated by arrow 103A or 103B in FIG. 4. Therefore, mechanical damages are sequentially formed on the entire back-side surface of wafer 21.

Even if such a treatment device is used, mechanical damage of about $1 \times 10^5$ (atoms/cm$^2$) can be formed on only the back-side surface of silicon wafer 21. Furthermore, since ultra-pure water is used, impurity fine particles and metal contamination attached to the back-side surface can be decreased, as in the case where the treatment device shown in FIGS. 1 and 2 is used.

Thus, with the above treating method, ultrasonic waves propagating in ultra-pure water are caused to propagate along the back-side surface of the semiconductor wafer, so that mechanical damages are formed. Therefore, cleanliness in this method can be greatly improved as compared to that in formation of mechanical damages by the conventional sandblasting.

We claim:

1. A method of treating the surface of a semiconductor wafer, comprising the steps of:
   disposing an ultrasonic generator in the bottom portion of a treatment bath filled with water;
   causing ultrasonic waves to propagate in the water to form mechanical damage on a first surface of the semiconductor wafer; and
   spraying a gas from the bottom portion of the treatment bath to generate bubbles in the water to prevent formation of mechanical damage on a second surface of the semiconductor wafer.

2. A method according to claim 1, wherein the output of the ultrasonic waves is selected within a range of 50 W to 500 W, and the frequency of the ultrasonic waves is selected within a range of 10 kHz to 100 kHz.

3. A method according to claim 1, wherein the gas is supplied after fine particles are removed through a gas filter.

4. A method according to claim 3, wherein the gas is selected from a group consisting of air and nitrogen.

5. A method according to claim 1, wherein each of partition walls are arranged between said semiconductor wafers, respectively.

6. A method according to claim 1, wherein each of said semiconductor wafers are rotated about a center axis when the mechanical damage is formed.

7. A method according to claim 1, wherein a plurality of semiconductor elements are formed in succeeding steps on the second surface.

8. A method according to claim 1, wherein the step of causing ultrasonic waves to propagate in the water further includes the step of simultaneously cleaning the wafer.

9. A method of treating the surfaces of each of a plurality of semiconductor wafers, comprising the steps of:
    placing each of the semiconductor wafers in a treatment bath filled with water;
    disposing an ultrasonic generator in the bottom portion of the treatment bath;
    causing ultrasonic waves to propagate in the water to form mechanical damage on a first surface of each of the semiconductor wafers; and
    spraying a gas from the bottom portion to generate bubbles in the water to prevent formation of mechanical damage on a second surface of each of the semiconductor wafers.

10. A method according to claim 9, wherein a plurality of semiconductor elements are formed in succeeding steps on the second surface.

11. A method according to claim 9, wherein the step of causing the ultrasonic waves to propagate in the water further includes the step of simultaneously cleaning the wafer.

12. A method according to claim 9, wherein the output of the ultrasonic waves is selected within a range of 50 W to 500 W, and the frequency of the ultrasonic waves is selected within a range of 10 kHz to 100 kHz.

13. A method according to claim 9, wherein the gas is supplied after fine particles are removed through a gas filter.

14. A method according to claim 13, wherein the gas is selected from a group consisting of air and nitrogen.

15. A method according to claim 9, wherein partition walls are arranged between said semiconductor wafers, respectively.

16. A method according to claim 9, wherein said semiconductor wafers are rotated about a center axis when the mechanical damage is formed.

17. A method of treating the surface of a semiconductor wafer, comprising the steps of:
    placing the semiconductor wafer on a rotating table;
    generating ultrasonic waves by an ultrasonic generator disposed within a nozzle containing water to cause the ultrasonic waves to propagate along a surface of the semiconductor wafer to form mechanical damage thereon; and
    spraying the water from the nozzle onto the surface of the rotating semiconductor wafer while the ultrasonic generator is generating ultrasonic waves.

18. A method according to claim 17, wherein the output of the ultrasonic waves is selected within a range of 50 Watts to 500 Watts, and the frequency of the ultrasonic waves is selected within a range of 10 kHz to 100 kHz.

19. A method according to claim 17, wherein a plurality of semiconductor elements are formed in succeeding steps on another surface opposite the one surface.

20. A method according to claim 17, wherein the step of causing the ultrasonic waves to propagate in the water further includes the step of simultaneously cleaning the wafer.

21. A method of treating the surfaces of a semiconductor wafer, comprising the steps of:
    placing the semiconductor wafer in a treatment bath filled with a treatment solution;
    disposing an ultrasonic generator in the bottom portion of the treatment bath;
    causing ultrasonic waves to propagate in the treatment solution to form mechanical damage on a first surface of the semiconductor wafer; and
    spraying a gas from the bottom portion of the treatment bath to generate bubbles in the treatment solution to prevent formation of mechanical damage on a second surface of the semiconductor wafer.

22. A method according to claim 17, wherein said nozzle is movable in the directions along a line connecting the center and an outer periphery of said semiconductor wafer.

* * * * *

UNITED STATES PATENT AND TRADEMARK OFFICE
CERTIFICATE OF CORRECTION

PATENT NO. : 4,980,300
DATED : December 25, 1990
INVENTOR(S) : Moriya Miyashita et al.

It is certified that error appears in the above-identified patent and that said Letters Patent is hereby corrected as shown below:

Claim 5, column 5, and line 1 delete "each of"

Claim 5, column 5, and line 2 after "between" insert --each of--.

Signed and Sealed this

Thirteenth Day of October, 1992

*Attest:*

DOUGLAS B. COMER

*Attesting Officer*      *Acting Commissioner of Patents and Trademarks*